(12) United States Patent
Lamborn et al.

(10) Patent No.: US 9,318,694 B2
(45) Date of Patent: Apr. 19, 2016

(54) METHODS OF FORMING A MAGNETIC RANDOM ACCESS MEMORY ETCH SPACER AND STRUCTURES FORMED THEREBY

(71) Applicant: INTEL CORPORATION, Santa Clara, CA (US)

(72) Inventors: Daniel Lamborn, Hillsboro, OR (US); Oleg Golonzka, Beaverton, OR (US); Christopher Wiegand, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 92 days.

(21) Appl. No.: 14/140,758

(22) Filed: Dec. 26, 2013

(65) Prior Publication Data

US 2015/0188033 A1    Jul. 2, 2015

(51) Int. Cl.
*H01L 43/02* (2006.01)
*H01L 43/08* (2006.01)
*H01L 43/10* (2006.01)
*H01L 43/12* (2006.01)

(52) U.S. Cl.
CPC ................ *H01L 43/02* (2013.01); *H01L 43/08* (2013.01); *H01L 43/10* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 2003/0190770 A1* | 10/2003 | Yeom et al. | 438/113 |
| 2004/0127054 A1 | 7/2004 | Lee et al. | |
| 2009/0108888 A1* | 4/2009 | Gebara et al. | 327/148 |
| 2009/0141543 A1* | 6/2009 | Ho et al. | 365/158 |
| 2009/0159562 A1 | 6/2009 | Cho | |
| 2013/0034917 A1* | 2/2013 | Lee | 438/3 |

FOREIGN PATENT DOCUMENTS

| | | |
|---|---|---|
| JP | 2003-298150 A | 10/2003 |
| KR | 10-2010-0076557 A | 7/2010 |

OTHER PUBLICATIONS

International Search Report and Written Opinion for PCT/US2014/065984 International Filing Date Nov. 17, 2014 mailed Apr. 28, 2015, 13 pages.

* cited by examiner

*Primary Examiner* — Bilkis Jahan
*Assistant Examiner* — Kevin Quinto
(74) *Attorney, Agent, or Firm* — Blakely, Sokoloff, Taylor & Zafman LLP

(57) ABSTRACT

Methods of forming a memory device structure are described. Those methods may include forming a non-conductive spacer material on a top electrode of a magnetic tunnel junction structure, and then forming a highly selective material on the non-conductive spacer material of the magnetic tunnel junction prior to etching a bottom electrode of the magnetic tunnel junction.

24 Claims, 6 Drawing Sheets

US 9,318,694 B2

METHODS OF FORMING A MAGNETIC RANDOM ACCESS MEMORY ETCH SPACER AND STRUCTURES FORMED THEREBY

BACKGROUND OF THE INVENTION

The fabrication of magnetic tunnel junction devices, such as may be utilized in magnetic random access memory (MRAM) devices, typically comprise a top and bottom electrode separated by a barrier layer. The MRAM device operates by electrons tunneling through the barrier layer between the two electrodes. During fabrication of the device, various etch processing steps may be employed. Such etch processing may involve non-volatile source materials, and may create non-volatile byproducts. The non-volatile by-products, which may originate from electrode material, may redeposit on the tunnel junction during etch processing, and may cause electrical shorting between the electrodes. In order to prevent device failure from the electrical shorting, a spacer of non-electrical conducting material can be used to separate the top and bottom electrodes of the device.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
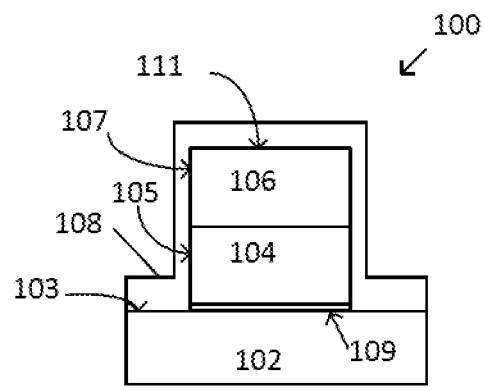
FIGS. 1a-1c represent cross-sectional views of structures according to various embodiments.

In the following detailed description, reference is made to the accompanying drawings that show, by way of illustration, specific embodiments in which the methods and structures may be a practiced. These embodiments described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing microelectronic structures, such as a magnetic tunnel junction device structures, are described. Those methods/structures may include forming a non-conductive spacer material on a top electrode of a magnetic tunnel junction structure, and then forming a highly selective material on the non-conductive spacer material of the magnetic tunnel junction prior to etching a bottom electrode of the magnetic tunnel junction. The magnetic tunnel junction device structures of the various embodiments disclosed herein enable the fabrication of MRAM devices which do not exhibit shorting between the ferromagnetic electrodes.

Figure 1B:
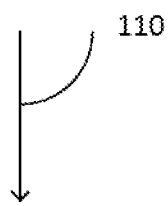
Figure 1B:
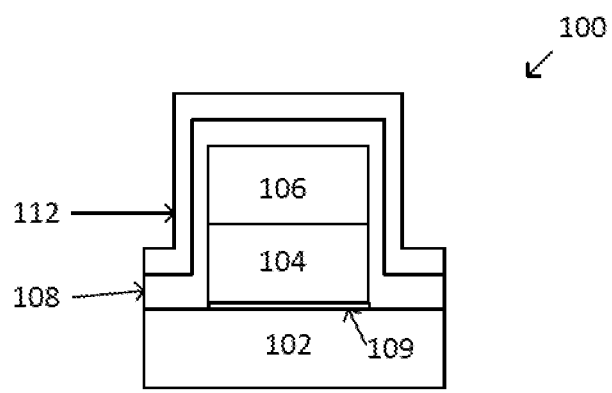
Figure 1C:
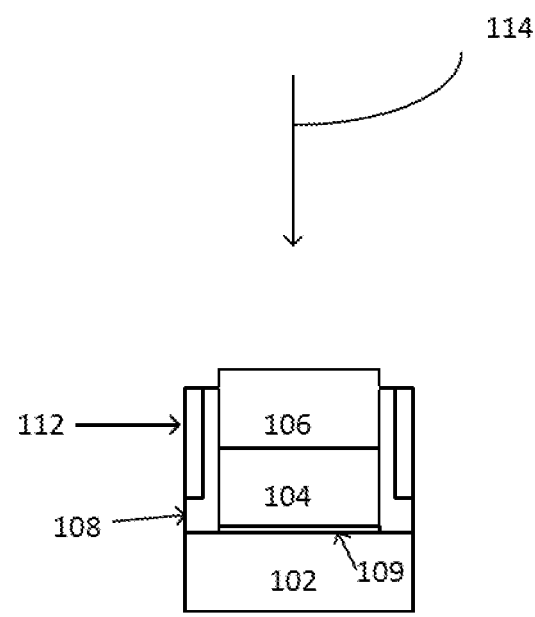

FIGS. 1a-1c illustrate cross-sectional views of embodiments of forming microelectronic structures, such as a magnetic tunnel junction (mtj) device, which may comprise a portion of a MRAM device. In FIG. 1a, a portion of a magnetic tunnel junction device/structure 100 is depicted. The magnetic tunnel junction device 100 comprises a bottom electrode 102, and a top electrode 104, wherein a tunnel barrier material 109 is disposed between the top electrode 104 and the bottom electrode 102. In an embodiment, the tunnel barrier layer 109 may comprise a dielectric material, such as a magnesium oxide material, for example, and may comprise a thickness of about 0.8 nanometers to about 1.5 nanometers.

In an embodiment, the bottom electrode 102 and/or the top electrode 104 may comprise ferromagnetic materials, such as cobalt-iron alloys. In an embodiment, the top and bottom electrodes comprise non-volatile materials. A hard mask 106 may be disposed on the top electrode 104. An insulator (non-conductive) spacer material 108 may be disposed on a top surface 103 of the bottom electrode 102, on the sidewalls 105 of the top electrode 104, and on the sidewalls 107 of the hard mask 106, and on a top surface 111 of the hard mask 106. In an embodiment, the insulator spacer material 108 may comprise a silicon dioxide material, and may serve to protect the top and bottom electrodes 104, 102 from a subsequent etching process. In an embodiment, the insulator spacer material 108 may comprises a thickness of about 1 to about 20 nanometers. In an embodiment, the insulator spacer material 108 may be formed after the top electrode 104 and the hard mask 106 have been etched.

In an embodiment, a formation process 110, such as a deposition process, may be utilized to form a highly selective material 112 on the insulator spacer material 108 (FIG. 1b). In an embodiment, the highly selective material 112 may comprise a thickness of about 1 nanometer to about 20 nanometers. The highly selective material 112 may comprise a metallic material in an embodiment. In another embodiment, the highly selective material 112 may comprise any such material that is highly selective as compared with the bottom electrode 102 material during an etching process. For example, during a bottom electrode etching process, the highly selective material 112 will exhibit little to no etching (removal), while the bottom electrode 102 material may be etched at a much higher rate. In an embodiment, the highly selective material may be etched at a rate that may be about 100 to about 1000 times less than the etch rate for the bottom electrode 102, for a given bottom electrode 102 etch chemistry.

Figure 5:
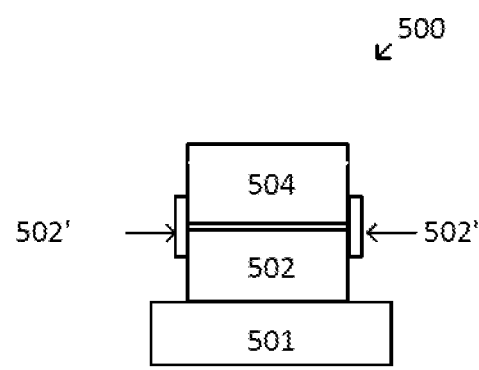
FIG. 5 represents a structure according to the Prior Art.

In an embodiment, an etch may be performed in which the bottom electrode 102 may be etched using an etch process 114 (FIG. 1c). The etch process 114 may comprise such chemistries as (NH3/Ar/CO), for example. During the etch process 114, the insulator spacer material 108 may be protected from the etch process 114 by the highly selective material 112. In prior art bottom electrode etch processes, the insulator spacer material may be substantially removed during the bottom electrode 502 (wherein the bottom electrode 502 may be disposed on a substrate 501) etch process, and re-deposited bottom electrode material 502' may be formed between the bottom and top electrodes 502, 504 (FIG. 5, Prior Art). This re-deposited bottom electrode material 502' may cause shorting between the bottom and top electrodes, which may cause failure of the mtj device 500.

Referring back to FIG. 1*c*, because the insulator spacer material 108 is protected during the etch 114 by the highly selective material 112, the insulator spacer material 108 remains intact along the sidewalls of the top electrode 104, thus preventing shorting between the top and bottom electrodes 104, 102. The hardmask 106 may be removed from the top electrode 104 during subsequent processing steps. In an embodiment, the highly selective material 112 may comprise a metallic spacer cap material to protect the nonconductive spacer 108 from etch damage. The highly selective material 112 provides a robust barrier to protect the nonconductive spacer material from etch damage. The etch by-products of the bottom etch process 114 can deposit on the highly selective material 112 but will not make any electrical path for shorting between the top and bottom electrodes 104, 102.

Figure 2:
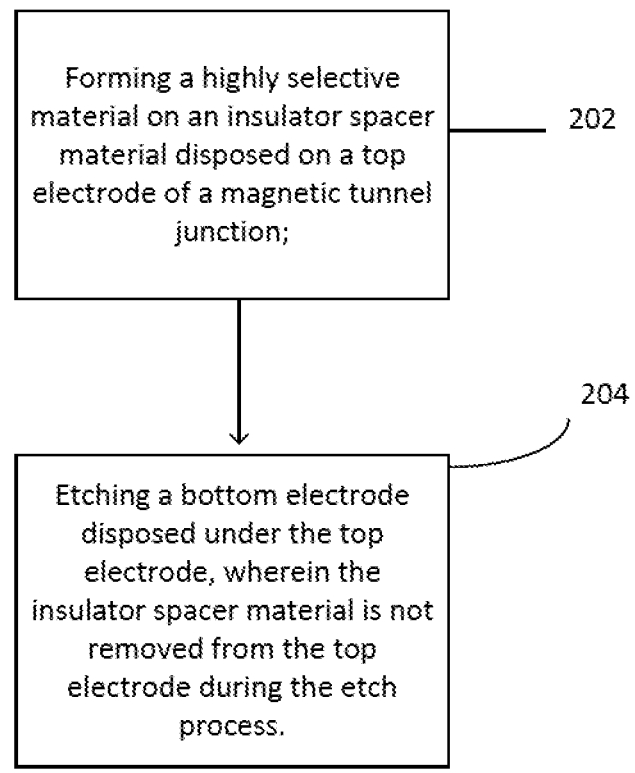
FIG. 2 represents a flow chart of a method according to embodiments.

In FIG. 2, a flowchart of an embodiment, is depicted. At step 202, a highly selective material is formed on an insulator spacer material disposed on a top electrode of a magnetic tunnel junction. At step 204, a bottom electrode disposed under the top electrode is etched, wherein the insulator spacer material is not removed from the top electrode during the etch process. Even though some of the bottom electrode may be re-deposited onto the highly selective material during etching, the top and bottom electrodes are not shorted between each other due to the presence of the highly selective material that prevents electrode re-deposition onto the top electrode during the bottom electrode etch process.

In an embodiment, the mtj devices of the embodiments herein may be coupled with any suitable type of package structures capable of providing electrical communications between a microelectronic device, such as a die and a next-level component to which the package structures may be coupled (e.g., a circuit board). In another embodiment, the devices herein may be coupled with a package structure that may comprise any suitable type of package structures capable of providing electrical communication between a die and an upper integrated circuit (IC) package coupled with the devices herein.

The devices of the embodiments herein may comprise circuitry elements such as LED structures. The devices may be coupled with other circuitry elements that may comprise logic circuitry for use in a processor die, for example. Metallization layers and insulating material may be included in the devices herein, as well as conductive contacts/bumps that may couple metal layers/interconnects to external devices/layers. In an embodiment, the bumps may comprise copper.

The devices described in the various Figures herein may comprise portions of a silicon logic die or a memory die, for example, or any type of suitable microelectronic device/die. In some embodiments the devices may further comprise a plurality of dies, which may be stacked upon one another, depending upon the particular embodiment. In some cases the die(s) of the devices herein may be located/attached/embedded on either the front side, back side or on/in some combination of the front and back sides of a package structure. In an embodiment, the die(s) may be partially or fully embedded in a package structure of the embodiments. The various embodiments of the mtj device structures herein enable a more reliable MRAM device fabrication.

Figure 3:
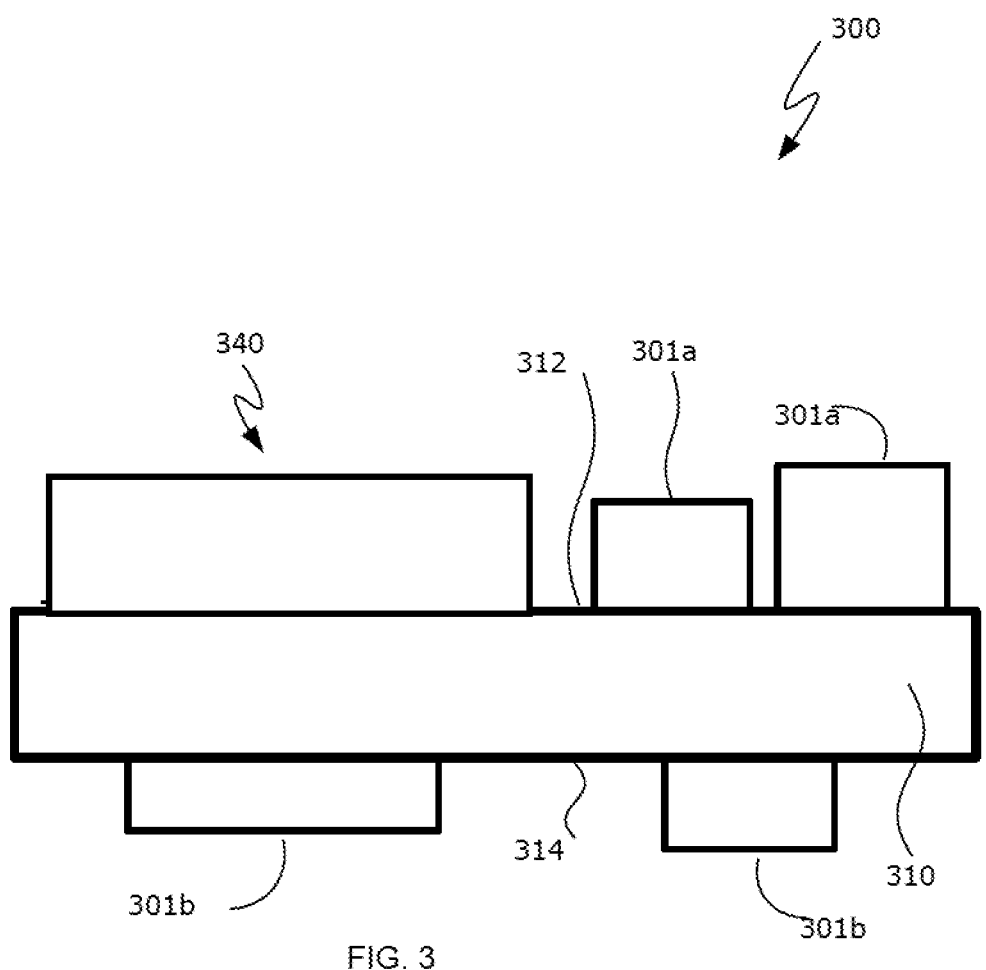
FIG. 3 represents a cross-sectional view of a system according to embodiments.

Turning now to FIG. 3, illustrated is a cross section of an embodiment of a computing system 300. The system 300 includes a number of components disposed on a mainboard 310 or other circuit board. Mainboard 310 includes a first side 312 and an opposing second side 314, and various components may be disposed on either one or both of the first and second sides 312, 314. In the illustrated embodiment, the computing system 300 includes a package structure 340 disposed on the mainboard's first side 312, wherein the package structure 340 may comprise any of the mjt device structure embodiments described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

In addition to the package structure 340, one or more additional components may be disposed on either one or both sides 312, 314 of the mainboard 310. By way of example, as shown in the figures, components 301*a* may be disposed on the first side 312 of the mainboard 310, and components 301*b* may be disposed on the mainboard's opposing side 314. Additional components that may be disposed on the mainboard 310 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 300 includes a radiation shield. In a further embodiment, the computing system 300 includes a cooling solution. In yet another embodiment, the computing system 300 includes an antenna. In yet a further embodiment, the assembly 300 may be disposed within a housing or case. Where the mainboard 310 is disposed within a housing, some of the components of computer system 300—e.g., a user interface device, such as a display or keypad, and/or a power supply, such as a battery—may be electrically coupled with the mainboard 310 (and/or a component disposed on this board) but may be mechanically coupled with the housing.

Figure 4:
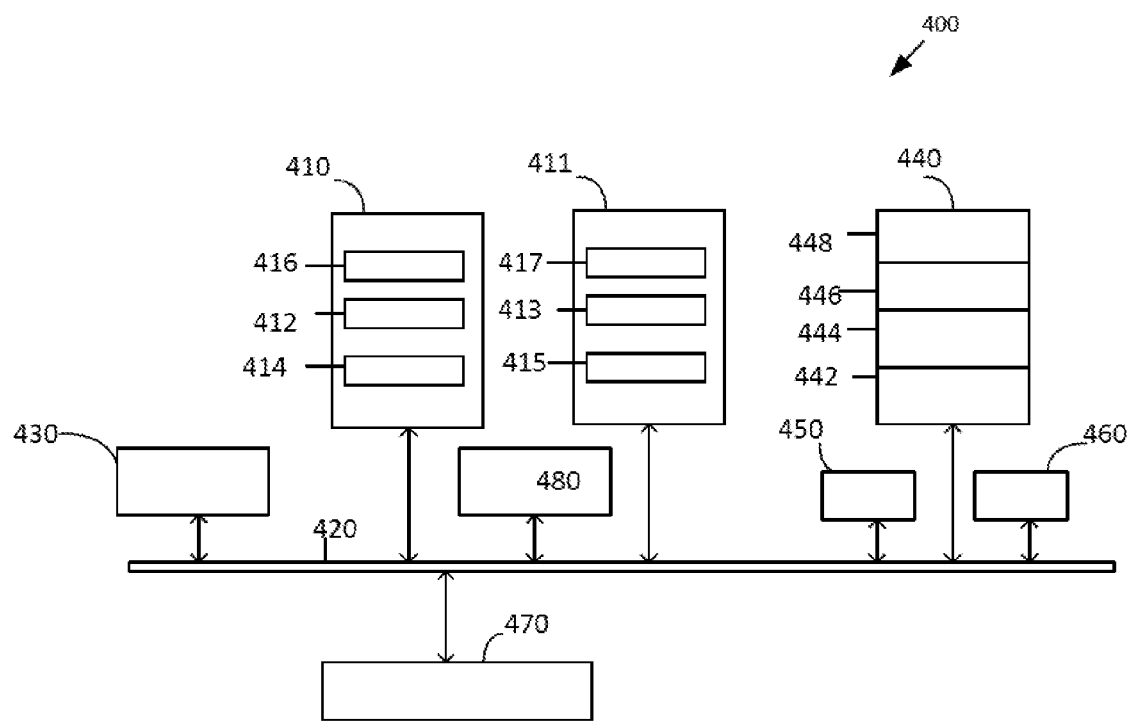
FIG. 4 represents a schematic of a system according to embodiments.

FIG. 4 is a schematic of a computer system 400 according to an embodiment. The computer system 400 (also referred to as the electronic system 400) as depicted can embody/include a package structure that includes any of the several disclosed embodiments of mtj devices and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be integral to an automobile. The computer system 400 may be integral to a television.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically, communicatively coupled to the system bus 420 and includes any circuit, or combination of circuits according to an embodiment, including the package/device of the various embodiments included herein. In an embodiment, the integrated circuit 410 includes a processor 412 that can include any type of mtj structures according to the embodiments herein. As used herein, the processor 412 may mean any type of circuit such as, but not limited to, a microprocessor, a microcontroller, a graphics processor, a digital signal processor, or another processor. In an embodiment, the processor 412 includes any of the embodiments of the device structures disclosed herein. In an embodiment, SRAM embodiments are found in memory caches of the processor.

Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems. In an embodiment, the processor 412 includes on-die memory 416 such as static random-access memory (SRAM). In an embodiment, the processor 412 includes embedded on-die memory 416 such as embedded dynamic random-access memory (eDRAM).

In an embodiment, the integrated circuit 410 is complemented with a subsequent integrated circuit 411. In an embodiment, the dual integrated circuit 411 includes embedded on-die memory 417 such as eDRAM. The dual integrated circuit 411 includes an RFIC dual processor 413 and a dual communications circuit 415 and dual on-die memory 417 such as SRAM. The dual communications circuit 415 may be configured for RF processing.

At least one passive device 480 is coupled to the subsequent integrated circuit 411. In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448. In an embodiment, the electronic system 400 also includes a display device 450, and an audio output 460. In an embodiment, the electronic system 400 includes an input device such as a controller 470 that may be a keyboard, mouse, touch pad, keypad, trackball, game controller, microphone, voice-recognition device, or any other input device that inputs information into the electronic system 400. In an embodiment, an input device 470 includes a camera. In an embodiment, an input device 470 includes a digital sound recorder. In an embodiment, an input device 470 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A method of forming a memory device structure comprising:
   forming a non-conductive spacer material on a top electrode of a magnetic tunnel junction structure, wherein a dielectric material is disposed between the top electrode and a bottom electrode of the magnetic tunnel junction structure;
   forming a highly selective material on the non-conductive spacer material; and
   etching the bottom electrode, wherein a portion of the bottom electrode is re-deposited on the highly selective material.

2. The method of claim 1 further comprising wherein the memory device comprises a MRAM memory device.

3. The method of claim 1 further comprising wherein the highly selective material comprises a metal material.

4. The method of claim 1 further comprising wherein the dielectric material comprises a tunnel barrier material.

5. The method of claim 1 further comprising wherein the top and bottom electrodes comprise a ferromagnetic material.

6. The method of claim 1 further comprising wherein an etch rate of the bottom electrode is much higher than an etch rate of the highly selective material.

7. The method of claim 1 wherein the bottom electrode and the top electrode comprise non-volatile materials.

8. The method of claim 1 further comprising wherein the non-conductive spacer material comprises a thickness of about 1 nanometers to about 20 nanometers, and wherein the highly selective material comprises a thickness of about 1 nanometers to about 20 nanometers.

9. A method of forming a MRAM device, comprising:
   forming a highly selective material on an insulator spacer material, wherein the insulator spacer material is disposed on sidewalls of a top electrode of a magnetic tunnel junction device and on a sidewall and top portion of a hardmask material, wherein the hardmask material is disposed on a top portion of the top electrode; and
   etching a bottom electrode disposed under the top electrode to expose the hardmask material, wherein the insulator spacer material is not removed from the sidewall of the top electrode wherein at least one of the top electrode or the bottom electrode comprises a ferromagnetic material.

10. The method of claim 9 further comprising wherein the highly selective material protects the insulator spacer material from being etched during the bottom electrode etch process.

11. The method of claim 9 further comprising wherein the top and bottom electrodes are not shorted to each other after the bottom electrode etch process.

12. The method of claim 9 further comprising wherein the bottom electrode and the top electrode are separated from each other by a tunnel barrier layer.

13. The method of claim 9 further comprising wherein the bottom electrode and the insulator spacer material are not highly selective to one another during the bottom electrode etch process.

14. A memory device structure comprising:
  a non-conductive spacer material disposed on a sidewall of top electrode of a magnetic tunnel junction structure, wherein a dielectric material is disposed between the top electrode and a bottom electrode of the magnetic tunnel junction structure wherein the non-conductive spacer material is laterally adjacent to the dielectric material and on a top surface of the bottom electrode but not adjacent to sidewalls of the bottom electrode; and
  a highly selective material disposed on the non-conductive spacer material disposed on the top surface of the bottom electrode.

15. The structure of claim 14 further comprising wherein the highly selective material comprises a metallic material.

16. The structure of claim 14 further comprising wherein the non-conductive spacer material is a continuous layer disposed on the sidewall of the top electrode.

17. The structure of claim 14 further comprising wherein the dielectric material comprises a tunnel barrier material.

18. The structure of claim 14 further comprising wherein the top and bottom electrodes comprise ferromagnetic materials.

19. The structure of claim 14 further comprising wherein the non-conductive spacer material comprises a thickness of about 1 nanometer to about 20 nanometers, and wherein the highly selective material comprises a thickness of about 1 nanometer to about 20 nanometers.

20. The structure of claim 14 further comprising wherein the memory device comprises a portion of a MRAM device.

21. The structure of claim 14 further comprising a system comprising: a bus communicatively coupled to the memory device structure; and an eDRAM communicatively coupled to the bus.

22. A method of forming a memory device structure comprising:
  forming a non-conductive spacer material on a top electrode of a magnetic tunnel junction structure, wherein a dielectric material is disposed between the top electrode and a bottom electrode of the magnetic tunnel junction structure;
  forming a highly selective material on the non-conductive spacer material; and
  etching the bottom electrode, wherein the top and bottom electrodes comprise a ferromagnetic material.

23. The method of claim 22 further comprising wherein the memory device comprises a MRAM memory device.

24. The method of claim 22 further comprising wherein the highly selective material comprises a metal material.

* * * * *